United States Patent
Ko et al.

(10) Patent No.: US 9,741,630 B2
(45) Date of Patent: Aug. 22, 2017

(54) ELECTRONIC COMPONENT PACKAGE AND METHOD OF MANUFACTURING THE SAME

(71) Applicant: SAMSUNG ELECTRO-MECHANICS CO., LTD., Suwon-si, Gyeonggi-do (KR)

(72) Inventors: Young Gwan Ko, Suwon-si (KR); Sung Won Jeong, Suwon-si (KR)

(73) Assignee: SAMSUNG ELECTRO-MECHANICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/201,990

(22) Filed: Jul. 5, 2016

(65) Prior Publication Data
US 2017/0178984 A1 Jun. 22, 2017

(30) Foreign Application Priority Data
Dec. 21, 2015 (KR) .......... 10-2015-0183172

(51) Int. Cl.
| | | |
|---|---|---|
| H01L 23/48 | (2006.01) | |
| H01L 23/52 | (2006.01) | |
| H01L 29/40 | (2006.01) | |
| H01L 21/44 | (2006.01) | |
| H01L 21/48 | (2006.01) | |
| H01L 21/50 | (2006.01) | |
| H01L 21/66 | (2006.01) | |
| H01L 23/31 | (2006.01) | |
| H01L 23/522 | (2006.01) | |
| H01L 21/56 | (2006.01) | |
| H01L 23/00 | (2006.01) | |

(52) U.S. Cl.
CPC ............ *H01L 22/34* (2013.01); *H01L 21/565* (2013.01); *H01L 23/3178* (2013.01); *H01L 23/5226* (2013.01); *H01L 24/48* (2013.01); *H01L 24/85* (2013.01)

(58) Field of Classification Search
CPC ... H01L 21/565; H01L 22/34; H01L 23/3178; H01L 23/5226
USPC .......................................... 257/774; 438/118
See application file for complete search history.

(56) References Cited

U.S. PATENT DOCUMENTS

2008/0197479 A1* 8/2008 Kim ................. G06K 19/07743
257/698
2009/0008762 A1 1/2009 Jung

FOREIGN PATENT DOCUMENTS

| KR | 10-2009-0002573 A | 1/2009 |
|---|---|---|
| KR | 10-1362714 B1 | 2/2014 |
| KR | 10-1362715 B1 | 2/2014 |
| KR | 10-1368793 B1 | 2/2014 |

(Continued)

*Primary Examiner* — David S Blum
(74) *Attorney, Agent, or Firm* — McDermott Will & Emery LLP

(57) ABSTRACT

An electronic component package includes a wiring part including an insulating layer, a conductive pattern formed on the insulating layer, and a conductive via connected to the conductive pattern through the insulating layer, an electronic component disposed on the wiring part, a frame disposed on the wiring part and having a through hole accommodating the electronic component, an adhesive layer bonding the wiring part and the frame to each other, and an encapsulant filling at least a portion of the through hole.

25 Claims, 7 Drawing Sheets

(56) References Cited

FOREIGN PATENT DOCUMENTS

KR 10-2014-0126125 A 10/2014

* cited by examiner

ELECTRONIC COMPONENT PACKAGE AND METHOD OF MANUFACTURING THE SAME

CROSS-REFERENCE TO RELATED APPLICATION

This application claims benefit of priority to Korean Patent Application No. 10-2015-0183172, filed on Dec. 21, 2015 with the Korean Intellectual Property Office, the disclosure of which is incorporated herein by reference.

TECHNICAL FIELD

The present disclosure relates to an electronic component package and manufacturing method thereof.

BACKGROUND

An electronic component package refers to package technology for electrically connecting an electronic component to a printed circuit board (PCB), such as a main board of an electronic device, and protecting the electronic component from external impacts. Recently, one major trend of technical development regarding electronic components is reducing a size of components, and in line with this, in a package field, electronic components having a reduced size while retaining a plurality of pins are required to meet the rapid demand for miniaturized electronic components.

A wafer level package (WLP) using a redistribution line (RDL) of an electrode pad of an electronic component formed on a wafer has been proposed as a package technique to meet the aforementioned technical requirements. The WLP includes a fan-in WLP and a fan-out WLP, and in particular, the fan-out WLP, advantageous for realizing a plurality of pins with a reduced size, has been actively developed in recent years.

Meanwhile, when such a package is manufactured, an electrical test is required to determine whether the package is defective or not. Conventionally, the electrical test is generally performed after an electronic component such as an integrated circuit (IC) chip is mounted in the package. However, in a case in which an electrical test is performed with the electronic component mounted in the package and the package is determined to be defective, even the electronic component, in addition to a wiring layer forming the package, may have to be discarded, creating significant loss for manufacturers.

SUMMARY

An aspect of the present disclosure may provide an electronic component package having a compact structure and allowing for electrical inspection of a wiring part of the electronic component package before an electronic component is mounted to the wiring part to thus significantly enhance manufacturing efficiency.

An aspect of the present disclosure may also provide a method of effectively manufacturing the aforementioned electronic component package.

According to an aspect of the present disclosure, an electronic component package may include: a wiring part including an insulating layer, a conductive pattern formed on the insulating layer, and a conductive via connected to the conductive pattern through the insulating layer; an electronic component disposed on the wiring part; a frame disposed on the wiring part and having a through hole accommodating the electronic component; an adhesive layer bonding the wiring part and the frame to each other; and an encapsulant filling at least a portion of the through hole.

According to another aspect of the present disclosure, a method of manufacturing an electronic component package may include: preparing a wiring part including an insulating layer, a conductive pattern formed on the insulating layer, and a conductive via connected to the conductive pattern through the insulating layer; disposing an electronic component on the wiring part; preparing a frame having a through hole and bonding the frame to an upper surface of the wiring part by an adhesive layer; and forming an encapsulant to fill at least a portion of the through hole.

According to another aspect of the present disclosure, an electronic component package may include: a wiring part including an insulating layer, a conductive pattern formed on the insulating layer, and a conductive via connected to the conductive pattern through the insulating layer; an electronic component disposed on the wiring part and having an electrode pad electrically connected to the conductive pattern through a conductive structure disposed therebetween; a frame disposed on the wiring part and having a through hole accommodating the electronic component; an adhesive layer bonding the wiring part and the frame to each other; and an encapsulant filling at least a portion of the through hole. A melting temperature of the conductive structure is lower than that of the conductive pattern of the wiring part and the electrode pad of the electronic component.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower."

Electronic Device

Figure 1:
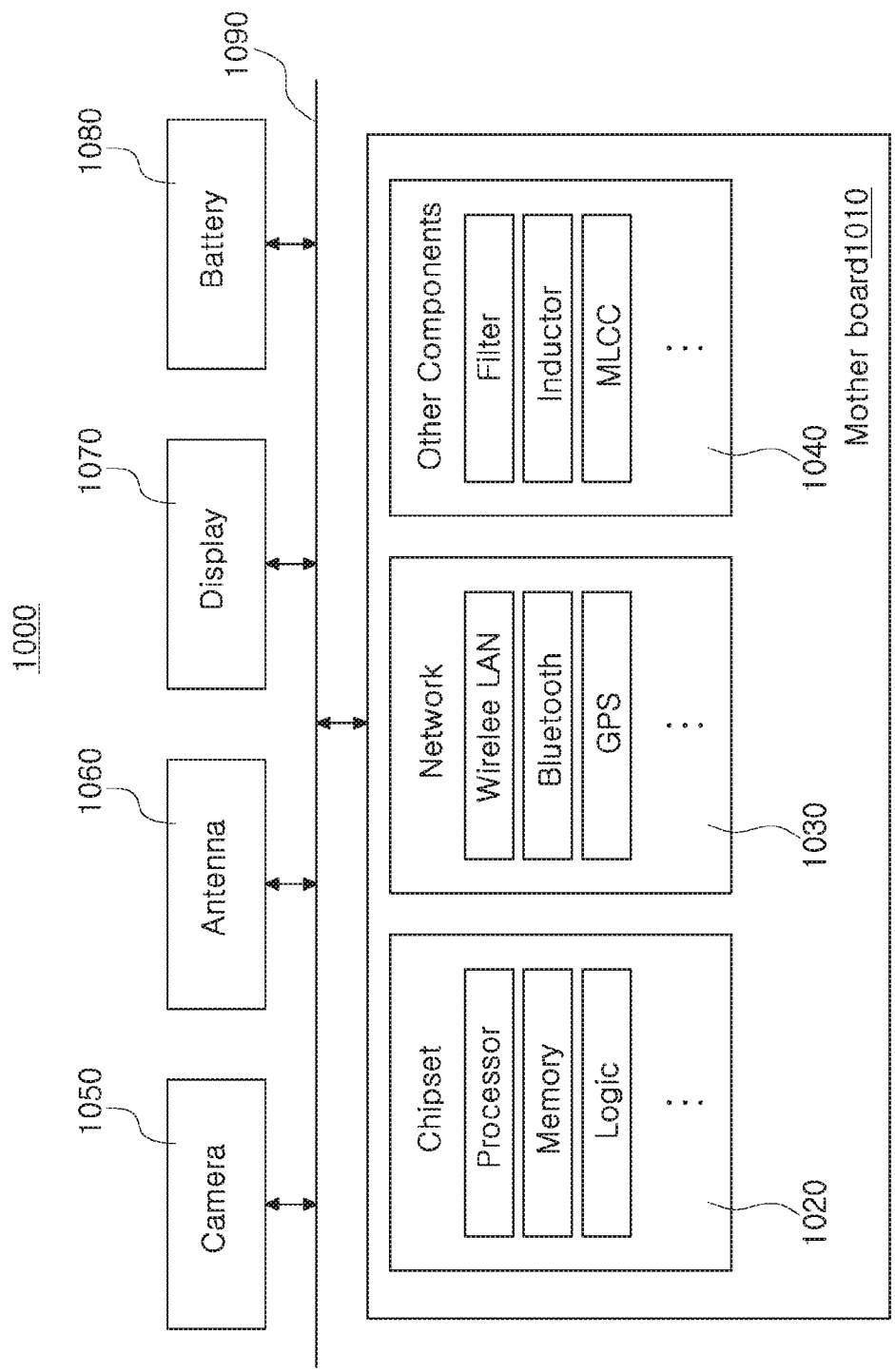
FIG. 1 is a block diagram schematically illustrating an example of an electronic device system.

FIG. 1 is a block diagram schematically illustrating an example of an electronic device system. Referring to FIG. 1, an electronic device 1000 includes a main board (or mother board) 1010. A chip-related component 1020, a network-related component 1030, and other components 1040 are physically and/or electrically connected to the main board 1010. These components are also coupled to other components as described hereinafter to form various signal lines 1090.

The chip-related component 1020 includes a memory chip such as a volatile memory (for example, a DRAM), a non-volatile memory (for example, a ROM), or a flash memory, an application processor chip such as a central processor (for example, a CPU), a graphics processor (for example, a GPU), a digital signal processor, a cryptography processor, a microprocessor, or a microcontroller, and a logic chip such as an analog-to-digital converter (ADC), or an application-specific integrated circuit (ASIC). However the chip-related component 1020 is not limited thereto, and may include any other types of chip-related component. Also, these components 1020 may be combined with each other.

The network-related component 1030 may include Wi-Fi (IEEE 802.11 family, etc.), WiMAX (IEEE 802.16 family, etc.), IEEE 802.20, LTE (long term evolution), Ev-DO, HSPA+, HSDPA+, HSUPA+, EDGE, GSM, GPS, GPRS, CDMA, TDMA, DECT, Bluetooth, 3G, 4G, 5G, and certain other wireless/wired protocols designated thereafter. However, the network-related component 1030 is not limited thereto, and may include any other wireless or wired standards or protocols. Also, these components 1030 may be combined together with the aforementioned chip-related component 1020.

The other components 1040 may include a high frequency (HF) inductor, a ferrite inductor, a power inductor, ferrite beads, low-temperature co-firing ceramics (LTCC), an electro-magnetic interference (EMI) filter, a multilayer ceramic condenser (MLCC), and the like. However, the other components 1040 are not limited thereto, and may include passive components, or the like, used for various other purposes. Also, these components 1040 may be combined together with the aforementioned chip-related component 1020 and/or the network-related component 1030.

The electronic device 1000 may include any other components that may or may not be physically and/or electrically connected to the main board 1010 according to types of the electronic device 1000. These components include a camera 1050, an antenna 1060, a display 1070, a battery 1080, an audio codec (not shown), a video codec (not shown), a power amplifier (not shown), a compass (not shown), an accelerometer (not shown), a gyroscope (not shown), a speaker (not shown), a mass storage device (for example, a hard disk drive) (not shown), a compact disc (not shown), and a digital versatile disc (not shown). However, the any other components are not limited thereto, and may include other components used for various purposes according to types of the electronic device 1000.

The electronic device 1000 may be a smartphone, a personal digital assistant (PDA), a digital video camera, a digital still camera, a network system, a computer, a monitor, a tablet, a laptop computer, a netbook, a television, a video game console, or a smart watch. However, the electronic device 1000 is not limited thereto, and may be any other certain electronic device processing data.

Figure 2:
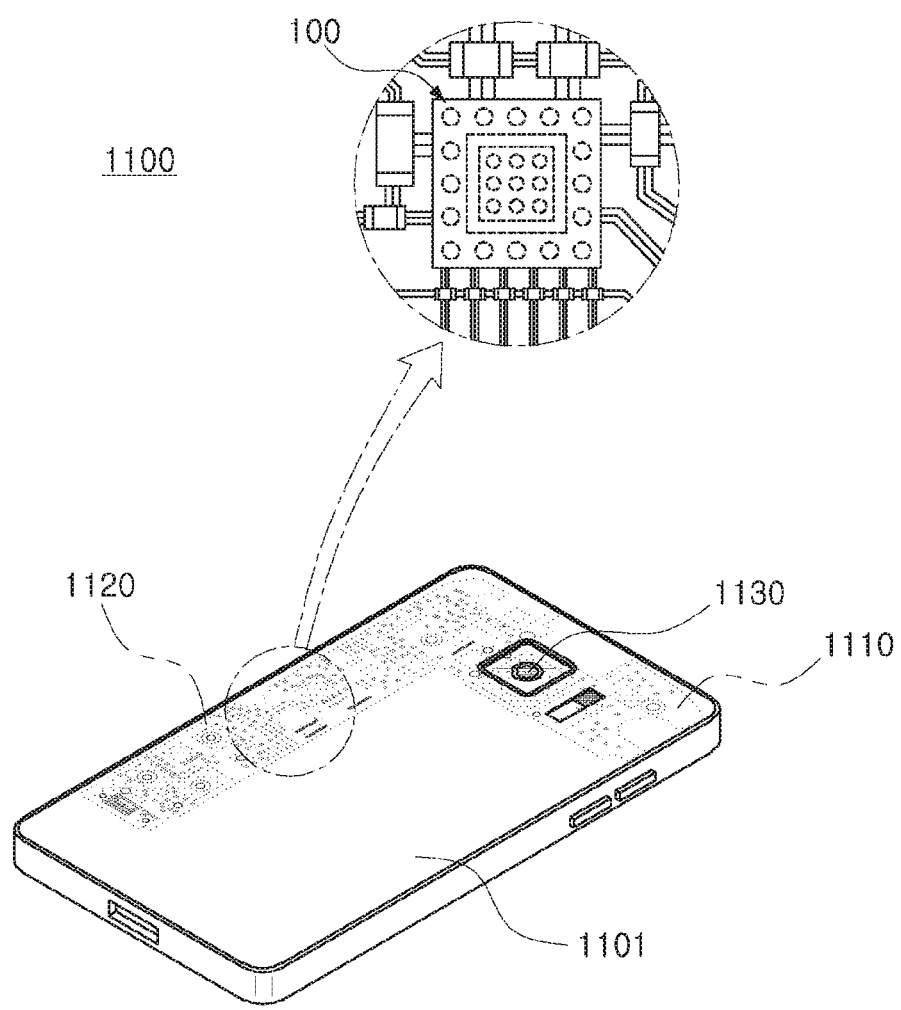
FIG. 2 is a view schematically illustrating an example of an electronic component package applied to an electronic device.

FIG. 2 is a view schematically illustrating an example of an electronic component package applied to an electronic device. The electronic component package is applied to various electronic devices 1000 for various purposes as described above. For example, a main board 1110 is accommodated within a body 1101 of a smartphone 1100, and various electronic components 1120 are physically and/or electrically connected to the main board 1110. Also, another component that may be physically and/or electrically connected to the main board 1110, or not, such as a camera 1130, may be accommodated within the body 1101. Here, some of the electronic components 1120 may be chip-related components as described above, and an electronic component package 100 may be an application processor, for example, but is not limited thereto.

Electronic Component Package and Method of Manufacturing the Same

Figure 3:
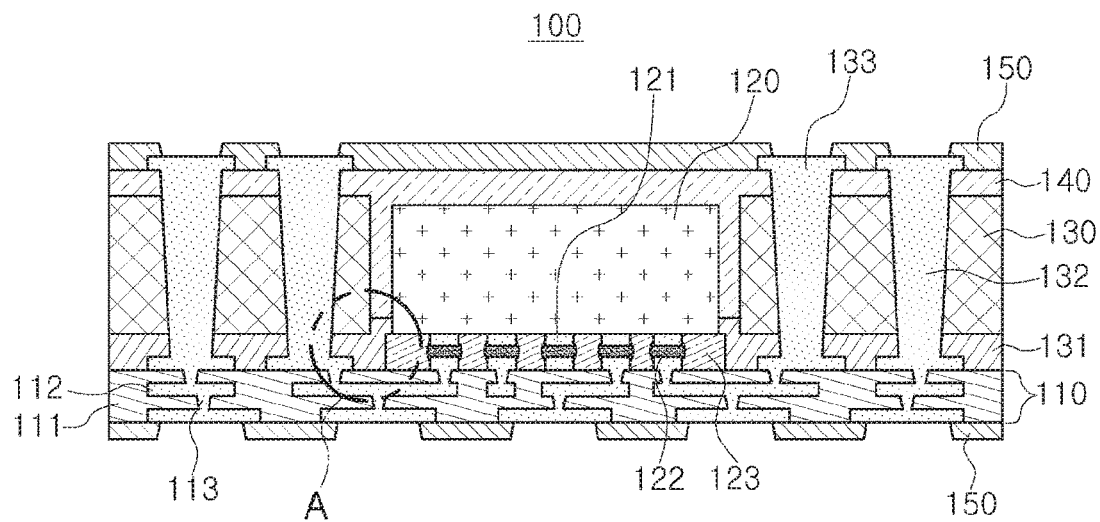
FIG. 3 is a cross-sectional view schematically illustrating an example of an electronic component package.

FIG. 3 is a cross-sectional view schematically illustrating an example of an electronic component package. An electronic component package 100 according to an exemplary embodiment may include a wiring part 110, an electronic component 120, a frame 130, an adhesive layer 131, and an encapsulant 140 as major components.

The wiring part 110 may be provided as a mounting region of the electronic component 120 and electrically connected to the electronic component 120. The wiring part 110 may include an insulating layer 111, a conductive pattern 112, and a conductive via 113, and may serve to re-distribute a wiring structure of the electronic component 120. In the example of FIG. 3, the wiring part 110 illustrated has a multilayer structure, but the wiring part 110 may be formed as a monolayer as necessary. Also, the wiring part 110 may have a larger amount of layers according to design particulars.

As an insulating material that may be included in the insulating layer 111, a thermosetting resin such as an epoxy resin, a thermoplastic resin such as polyimide, a resin obtained by impregnating the thermosetting resin or the thermoplastic resin with a stiffener such as glass fiber or an inorganic filler, such as pre-preg, Ajinomoto build-up film (ABF), FR-4, bismaleimide triazine (BT) resin, and the like, may be used. Also, in a case in which a photocurable material (PID) is used as an insulating material, the insulating layer 111 may be formed to be thinner and a micropattern may be more easily realized. The insulating layers 111 forming respective layers of the wiring part 110 may be formed of the same material, and may be formed of different materials as necessary. A thickness of the insulating layer 111 is not particularly limited. For example, a thickness of each layer, excluding a conductive pattern 112, may range from about 5 μm to 20 μm, and may range from about 15 μm to 70 μm with the conductive pattern 112 included.

The conductive pattern 112 may serve as a wiring pattern and/or a pad pattern, and may be formed of an electrically conductive material such as copper (Cu), aluminum (Al), silver (Ag), tin (Sn), gold (Au), nickel (Ni), lead (Pd), or alloys thereof. The conductive pattern 112 may perform various functions according to a design of a corresponding layer. For example, the conductive pattern 112 may serve as a ground (GND) pattern, a power (PWR) pattern, a signal (S) pattern, or as a redistribution pattern. Here, the signal (S) pattern includes various signals, such as a data signal, or the like, excluding the ground (GND) pattern and the power (PWR) pattern. Also, the conductive pattern 112 may serve as a via pad or an external connection terminal pad, as a pad pattern. A thickness of the conductive pattern 112 is not particularly limited, and may range from 10 μm to 50 μm, for example.

A surface-treated layer may be formed on the conductive pattern 112 positioned to be exposed to the outside of the insulating layer 111, for example, the conductive pattern connected to the electronic component 120 as necessary. The surface-treated layer is not particularly limited as long as it is known in the art, and may be formed through electrolytic gold plating, electroless gold plating, organic solderability preservative (OSP) or electroless tin plating, electroless silver plating, electroless nickel plating/immersion gold plating, direct immersion gold (DIG) plating, hot air solder leveling (HASL), and the like.

In the present exemplary embodiment, the conductive pattern 112 positioned on the surface of the wiring part 110 opposing the surface thereof on which the electronic component 120 is disposed, that is, disposed on a lower surface of the wiring part 110 in FIG. 3, may function as a connection pad which becomes a connection path with another board or device, and, as described hereinafter, the conductive pattern 112 may be embedded in the insulating layer 111 through a process using a support.

The conductive via 113 may electrically connect the conductive patterns 112, or the like, formed on different layers to each other, and as a result may form an electrical path within the package 100. As a formation material of the conductive via 113, a conductive material such as copper (Cu), aluminum (Al), silver (Ag), tin (Sn), gold (Au), nickel (Ni), lead (Pd), or alloys thereof may also be used. The conductive via 113 may be completely filled with a conductive material, or a conductive material may be formed on a wall of the via. The conductive via 113 may have any shape known in the art, such as a tapered shape in which a diameter thereof is decreased toward a lower surface thereof, a reverse tapered shape in which a diameter thereof is increased toward the lower surface thereof, and a cylindrical shape.

The frame 130, disposed on the wiring part 110 to support the package 100 may maintain rigidity and secure thickness uniformity. The frame 130 may have a through hole for disposing the electronic component 120, and such a through hole may be formed by an inner wall surrounding the electronic component 120. The electronic component 120 may be positioned within the through hole. According to exemplary embodiments, a region in which the electronic component 120 is disposed may have a shape of a trench, rather than the shape of the through hole.

A material used to form the frame 130 is not particularly limited, and a molding resin or pre-preg, preferably a metal or a ceramic material, may be used. For example, as described hereinafter, after a hole is formed in the pre-preg, the frame 130 may be bonded to the wiring part 110, and to this end, an adhesive layer 131 may be interposed between the frame 130 and the wiring part 110.

In the present exemplary embodiment, a conductive via 132 penetrating through the frame 130 and serving as an electrically conductive structure of upper and lower portions may be formed in the frame 130. For example, as illustrated in FIG. 3, the conductive via 132 of the frame 130 may be provided in such a manner that the conductive via 132 may be connected to the conductive pattern 112 of the wiring part 110 and the conductive pattern 133 formed on an upper portion of the frame 130. The conductive pattern 133, an element formed on the encapsulant 140 and electrically connected to the conductive via 132 of the frame 130, may be connected to an additional electronic component that may be disposed on an upper portion thereof. In this case, the conductive via 132 may be formed by forming a hole in the frame 130 and filling the hole through a method such as plating, or the like, or may be formed as a conductive post.

The electronic component 120 may be various active components (such as a diode, a vacuum tube, a transistor, etc.) or passive components (such as an inductor, a condenser, a resistor, etc.). Also, the electronic component 120 may be an integrated circuit (IC) chip as a single chip in which hundreds of to millions of or more elements are integrated. If necessary, the electronic component 120 may be an electronic component in which an IC is packaged as a flipchip. The IC chip may be an application processor chip such as a central processor (such as a CPU), a graphics processor (such as a GPU), a digital signal processor, a cryptography processor, a microprocessor, or a microcontroller, for example, but is not limited thereto. Here, in FIG. 3, a configuration in which one electronic component 120 is mounted on the wiring part 110 is illustrated, but two or more components may also be used.

The electronic component 120 may include one or more electrode pad 121 electrically connected to the wiring part 110, and as illustrated in the example of FIG. 3, the electronic component 120 may be mounted in a state in which the electrode pads 121 thereof face the wiring part 110. The electronic component 120 may be redistributed by the wiring part 110, and to this end, the conductive pattern 112 of the wiring part 110 and an adhesive electric connection portion 122 such as a solder, or the like, may be interposed between the electronic component 120 and the wiring part 110. Also, in order to stably mount the electronic component 120, an adhesive portion 123 formed of an insulating adhesive layer, or the like, may be interposed between the electronic component 120 and the wiring part 110. Here, the adhesive portion 123 may be appropriately modified or excluded according to exemplary embodiments. For example, the adhesive portion 123 may be a solder resist formed to expose the electrode pads 121 of the electronic component 120. A thickness of the electronic component 120 in a cross-section thereof is not particularly limited, and may vary according to types of the electronic component 120. For example, in a case in which the electronic component 120 is an IC chip, the thickness of the electronic component 120 in the cross-section thereof may range from about 100 μm to 480 μm, but is not limited thereto.

The encapsulant 140, which serves to protect the electronic component 120, covers the electronic component 120 and fills at least a portion of the through hole of the frame 130. Also, as illustrated in FIG. 3, the encapsulant 140 may be formed to cover up to an upper portion of the frame 130. In this case, a corresponding portion of the encapsulant 140 formed on the upper portion of the frame 130 may expose a region corresponding to the conductive via 132 of the frame 130, and through this configuration, an additional electronic component, or the like, may be mounted on the upper portion.

A material used to form the encapsulant 140 is not particularly limited as long as the encapsulant 140 may perform the function of protecting the electronic component. For example, the encapsulant 140 may be formed of a thermosetting resin such as an epoxy resin, a thermoplastic resin such as polyimide, a resin obtained by impregnating the thermosetting resin or the thermoplastic resin with a stiffener such as glass fiber or an inorganic filler, such as pre-preg, ABF, FR-4, BT, a PID resin, and the like. Also, the encapsulant 140 may be obtained by stacking an uncured resin film on the wiring part 110 and the frame 130 and curing the resin film, and in addition to this method, the encapsulant 140 may be obtained using a known molding scheme such as EMC, or the like.

In order to block electromagnetic waves, the encapsulant 140 may include conductive particles as necessary. Any conductive particles may be formed of any material as long as the material is able to block electromagnetic waves. For example, the conductive particles may be formed of copper (Cu), aluminum (Al), silver (Ag), tin (Sn), gold (Au), nickel (Ni), lead (Pd), or solder, but is not limited thereto.

The adhesive layer 131 is disposed between the wiring part 110 and the frame 130 to bond the wiring part 110 and the frame 130, and serves to bond the appropriately processed frame 130 to the wiring part 110 as described hereinafter in relation to a process. For example, the adhesive layer 131 may be formed of an uncured material, such as pre-preg or a solder resist, and may be electrically connected to the conductive pattern, or the like, using an electrically conductive material in addition to an electrically insulating material. When the adhesive layer 131 in an uncured state is pressed, the adhesive layer 131 may extend up to the through hole of the frame 130 (please refer to a region A). Here, as illustrated in FIG. 3, the adhesive layer 131 cured in a state of having been flown up to the through hole of the frame 130 may be in contact with the encapsulant 140 filling the through hole. That is, a portion of the adhesive layer 131 may be formed between an inner surface of the through hole and the electronic component 120. Such a shape of the adhesive layer 131 may be obtained through a bonding process of the wiring part 110 and the frame 130, providing structural stability of the package 100.

An external layer 150 may be formed in a lower portion of the wiring part 110 and an upper portion of the frame 130 in order to protect the wiring part 120 and the frame 130 from an external physical or chemical influence. In this case, the external layer 150 may have an opening exposing at least a portion of the conductive patterns 112 and 133. A material of the external layer 150 is not particularly limited, and a solder resist may be used, for example. In addition, the same material as that of the insulating layer 111 of the wiring part 110 may be used. The external layer 150 is generally a monolayer, but may be configured as a multilayer as necessary.

Although not shown, a connection terminal may be provided in the lowermost portion of the electronic component package 100. The connection terminal is a component physically and/or electrically connecting the electronic component package 100 to the exterior. For example, the electronic component package 100 is mounted on a main board of an electronic device through the connection terminal. The connection terminal is connected to the conductive pattern 112 through the opening formed in the external layer 150, and is also electrically connected to the electronic component 120 through the conductive pattern 112 and the conductive via 113. The connection terminal may be formed of, for example, a conductive material such as copper (Cu), aluminum (Al), silver (Ag), tin (Sn), gold (Au), nickel (Ni), lead (Pd), or solder, but a material of the connection terminal is not limited thereto. The connection terminal may be a land, a ball, or a pin. The connection terminal may be formed as a multilayer or a monolayer. When the connection terminal is formed as a multilayer, the connection terminal may include a copper pillar and a solder, and when the connection terminal is formed as a monolayer, the connection terminal may include, for example, tin-silver solder or copper, but is not limited thereto.

A portion of the external connection terminal may be disposed in a fan out region. The fan-out region refers to a region outside of a region in which an electronic component is disposed. That is, the electronic component package 100 according to an exemplary embodiment is a fan-out package. The fan-out package has excellent reliability, realizes a plurality of I/O terminals, and is easy to create a 3D interconnection in comparison to a fan-in package. Also, in comparison to a ball grid array (BGA) package or a land grid array (LGA) package, the fan-out package is able to be mounted on an electronic device without a separate board, which leads to a reduction in a thickness thereof and has excellent price competitiveness.

Since the aforementioned electronic component package 100 does not include aboard such as an interposer, or the like, it may be formed to have a compact size, and in addition, the electronic component package 100 may have a structure appropriate for a partial electrical test before an electronic component is mounted therein. Thus, unnecessary waste of the electronic component 120 which is relatively high in price among components of the package may be reduced. That is, when an electrical test is performed after the electronic components 120 are mounted, even if a wiring part, rather than the electronic component, is defective, the electronic component 120 becomes useless. Hereinafter, a method of manufacturing an electronic component package having the aforementioned structure in the present disclosure will be described. A package structure according to the aforementioned exemplary embodiment or the modified example may be more clearly understood through descriptions of the manufacturing method.

FIGS. 4 through 8 are cross-sectional views schematically illustrating a method of manufacturing an electronic component package according to an exemplary embodiment in the present disclosure.

Figure 4:
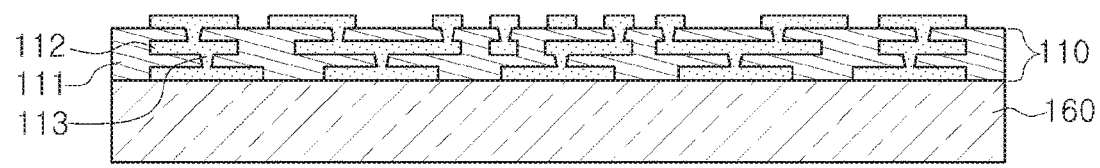
FIGS. 4 through 8 are cross-sectional views schematically illustrating a method of manufacturing an electronic component package according to an exemplary embodiment in the present disclosure.

First, as illustrated in FIG. 4, a wiring part 110 is formed on a support 160. The support 160 serves to handle the wiring part 110 which is relatively thin, and a material used to form the support 160 is not limited as long as it serves to support the wiring part 110. The support 160 may have a multilayer structure, and may include a release layer or a metal layer so that the support 160 may be readily removed with respect to the wiring part 110 in a follow-up process. In the present exemplary embodiment, as described hereinafter, an electrical test may be performed on the wiring part 110 in a state in which the support 160 is bonded to the wiring part 110.

In order to realize the wiring part 110, the insulating layer 111, the conductive pattern 112, and the conductive via 113 may be formed to have an intended shape, and the insulating layer 111, the conductive pattern 112, and the conductive via 113 may be formed repeatedly for a desired number of times. In detail, the insulating layer 111 may be formed through a known method. For example, the insulating layer 111 may be formed through a method of laminating and subsequently curing a material, or a method of coating and curing a material.

As the lamination method, for example, a method of pressing a material at high temperatures for a predetermined period of time and decompressing and cooling the material to room temperature in a hot press, and subsequently cooling the material in a cold press and separating a working tool, may be used. As the coating method, a screen printing method of applying ink with a squeegee, or a spray printing method of applying ink in a spray manner may be used. Here, curing may be drying in such a manner that a material is not completely cured in order to use a photolithography process as a post-process.

In the present exemplary embodiment, an electrical test may be performed at this stage before the electronic component 120 is mounted. In detail, it is determined whether the wiring part 110 is defective in terms of electrical connection. For example, a testing jig may be connected to the conductive pattern 112 in an upper portion of the wiring part 110. Through the electrical test, whether the wiring part 110 is defective may be determined in advance, minimizing an unnecessary waste of an electronic component. That is, when the wiring part 110 is determined to be defective in the test, the wiring part 110 may be discarded or recycled for another purpose, and a follow-up process may not be performed to reduce process cost. The wiring part 110 may have an additional structure such as a daisy chain for an electrical test, and thus, even in a state in which the support 160 is bonded to a lower surface of the wiring part 110, the electrical test may be performed on an upper surface of the wiring part 110.

Figure 5:
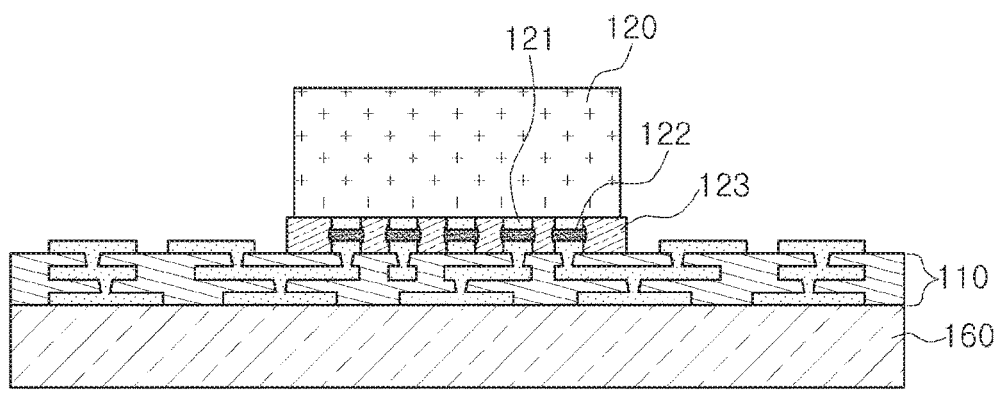

After the electrical test is performed on the wiring part 110, as illustrated in FIG. 5, the electronic component 120 is mounted on the wiring part 110, and in this case, the electronic component 120 may be disposed in such a manner that the electrode pad 121 faces the wiring part 110. In order to stably mount the electronic component 120, an adhesive electrical connection portion 122 such as a solder or the like and an adhesive portion 123 formed, for example, of an insulating adhesive layer, a solder resist, or the like may be formed on the wiring part 110 before the electronic component 120 is mounted.

Figure 6:
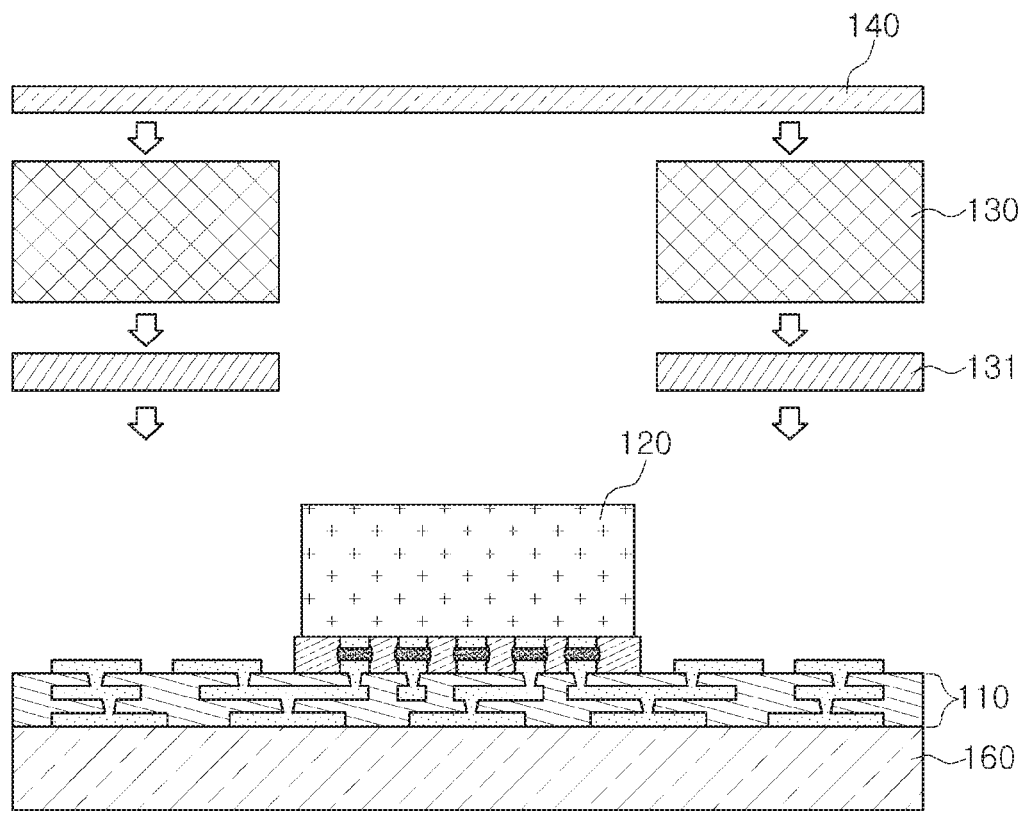

Thereafter, as illustrated in FIG. 6, a frame 130 having a through hole is prepared and bonded to the wiring part 110, and, to this end, an adhesive layer 131 is interposed between the frame 130 and the wiring part 110. Before the bonding process, a through hole is formed in the frame 130 at a position corresponding to the electronic component 120 through laser beam machining or mechanical machining. In this case, a material forming the frame 130 is not particularly limited, and pre-preg in a cured state may be used. Alternatively, any adhesive layer 131 may be used as long as it provides a stable bonding function. For example, prepreg in an uncured state or a solder resist may be used. Through this bonding process, the adhesive layer 131 may be cured in a state in which the adhesive layer 131 flows up to the through hole as described above.

In the present exemplary embodiment, a scheme in which the frame 130 is bonded after the electronic component 120 is mounted is described, but the order may be changed. That is, after an electrical test regarding the wiring part 110, the frame 130 may first be bonded and the electronic component 120 may then be mounted. In this case, the through hole may be formed before or after the frame 130 is bonded.

Figure 7:
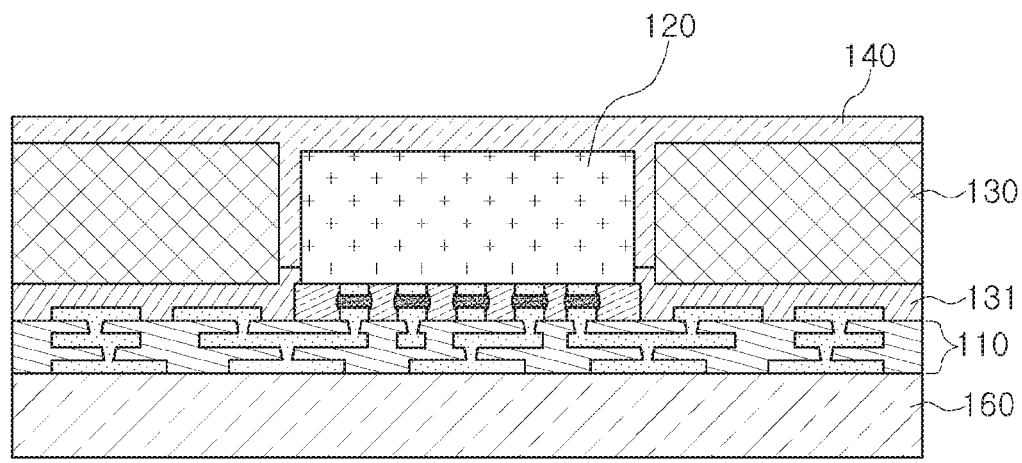

After or when the frame 130 is bonded, an encapsulant 140 is formed to cover the electronic component 120. In order to form the encapsulant 140, for example, a method of stacking a resin film such as ABF, or the like, in an uncured state on the wiring part 110 and the frame 130 and subsequently curing the resin film may be used. FIG. 7 illustrates a configuration including up to the encapsulant 140 formed. Here, although not shown, after the frame 130 is formed, the support 160 may be removed from the wiring part 110. Materials remaining after the support 160 is separated may be removed appropriately utilizing etching or a desmear method used in the art. However, the support 160 may not necessarily be removed in this stage and may also be removed in a follow-up process.

Figure 8:
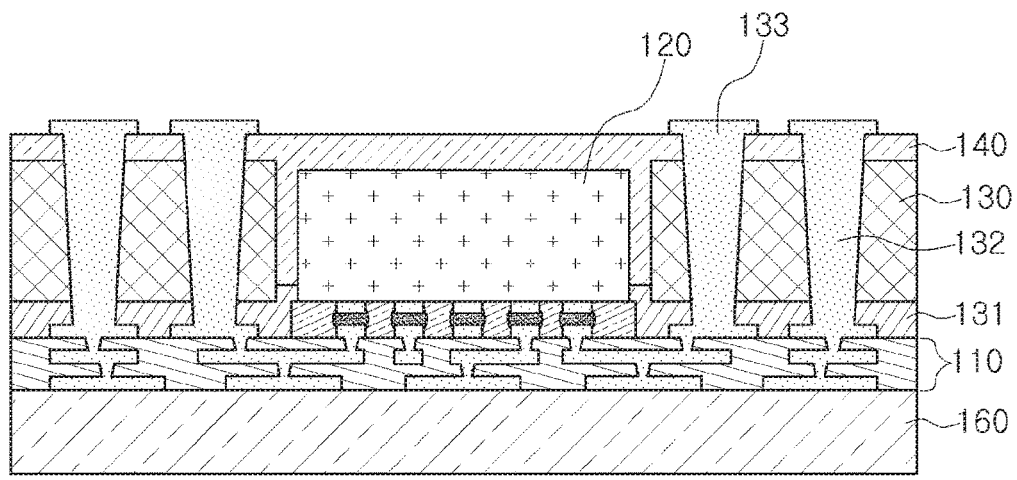

Thereafter, as illustrated in FIG. 8, a conductive via 132 and a conductive pattern 133 are formed in the frame 130. A hole is formed in the frame 130 and the encapsulant 140 through laser beam machining or mechanical machining, and filled with a conductive material through plating, or the like. Thereafter, an external layer such as solder resist is formed to have an appropriate pattern on upper and lower surfaces thereof, thus obtaining the package structure as illustrated in FIG. 3. Here, as in an exemplary embodiment described hereinafter, the conductive via 132 and the conductive pattern 133 may be obtained in advance through a method of appropriately processing the frame 130 and patterning a metal thin film before the frame 130 is bonded to the wiring part 110. Also, an additional electronic component may be stacked and mounted on an upper surface thereof, whereby a so-called package-on-package (POP) structure may be obtained and an additional encapsulant protecting the additional electronic component may be formed.

FIGS. 9 through 13 are cross-sectional views schematically illustrating a method of manufacturing an electronic component package according to another exemplary embodiment in the present disclosure.

Figure 9:
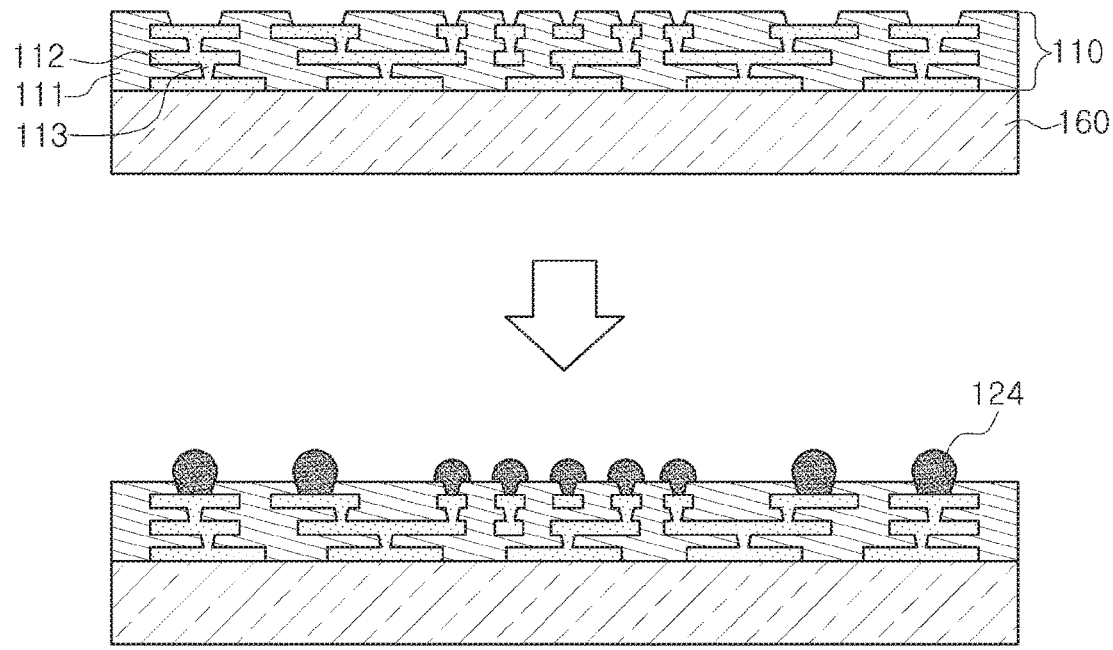
FIGS. 9 through 13 are cross-sectional views schematically illustrating a method of manufacturing an electronic component package according to another exemplary embodiment in the present disclosure.

First, as illustrated in the example of FIG. 9, a wiring part 110 is formed on the support 160, and the uppermost insulating layer 111 is configured to expose a portion of the conductive pattern 112. Thereafter, a conductive bump 124 is formed to be connected to the exposed conductive pattern 112. The conductive bump 124 serves to form a stable coupling structure with the electronic component 120 and the conductive via 132 of the frame 130. In this case, as described above, an electrical test may be performed on the wiring part 110 before the conductive bump 124 is formed.

Figure 10:
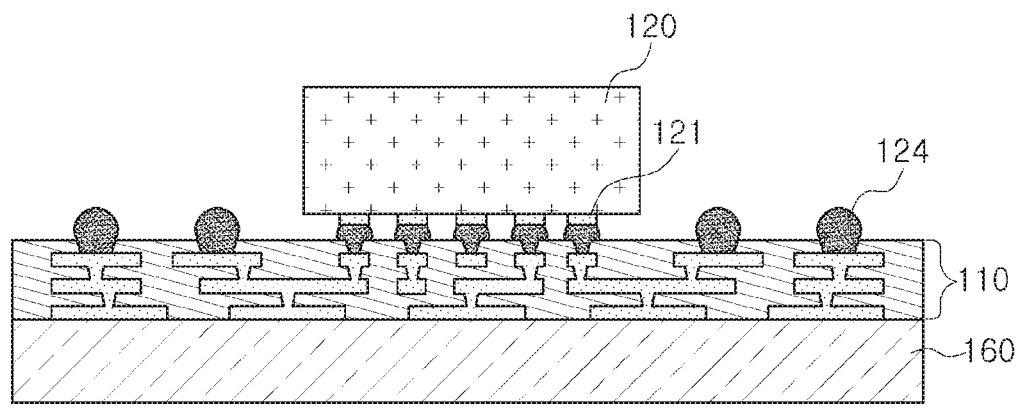
Figure 11:
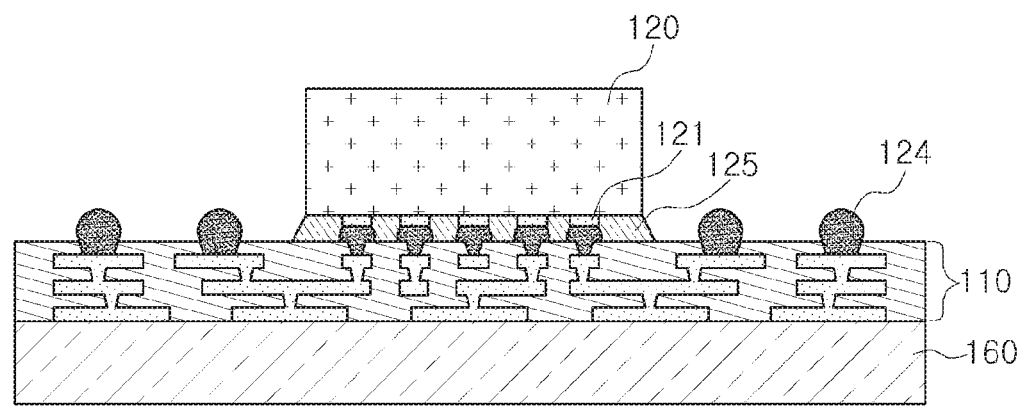

Thereafter, as illustrated in the example of FIG. 10, the electronic component 120 is disposed and mounted on the wiring part 110, and the electrode pad 121 may directly be connected to the conductive bump 124 using a process such as a reflow. After the electronic component 120 is mounted, an underfill resin 125, an electrically insulating material, may be provided on the wiring part 110 and on the electronic component 120 in order to obtain a more stable mounting structure as illustrated in FIG. 11.

Figure 12:
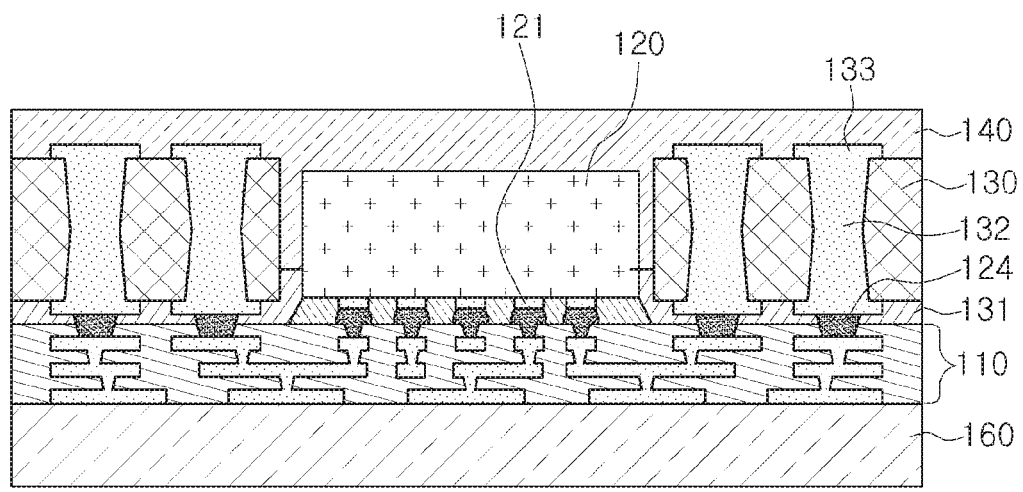

Thereafter, as illustrated in the example of FIG. 12, the frame 130 having the through hole is bonded to the wiring part 110 using an adhesive layer 131. In the present exemplary embodiment, the frame 130 may be bonded to the wiring part 110 in a state in which the conductive via 132 and the conductive pattern 133 are formed in advance in the frame 130. In a specific example, a copper clad laminate (CCL) may be used as a basic structure of the frame 130, and the frame 130 may be obtained by performing a process of hole processing on the CCL and filling the hole with a conductive material, and a process of appropriately patterning a metal thin film, and the like.

Figure 13:
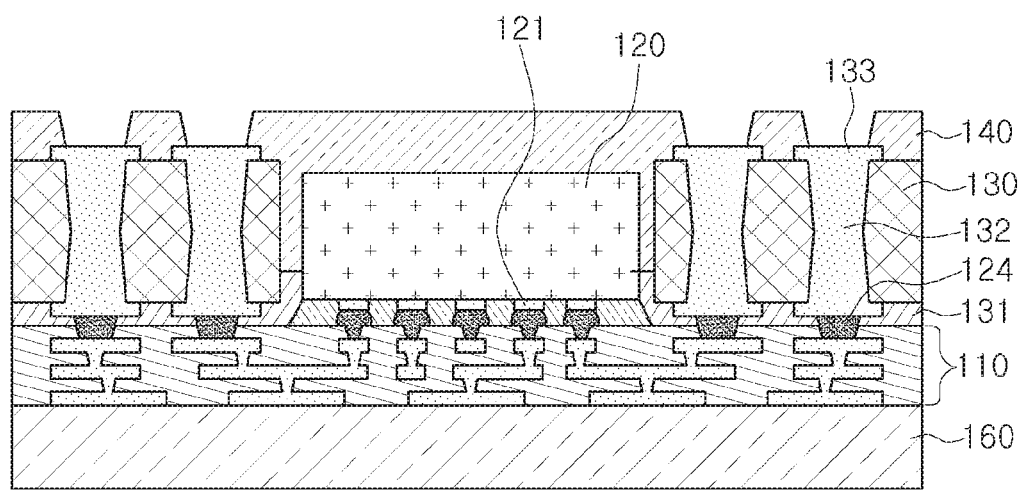

After or when the frame 130 is bonded in the same manner as that of the previous process, the encapsulant 140 covering the electronic component 120 is formed, and thereafter, as in the example illustrated in FIG. 13, an open area is formed in the encapsulant 140 using laser beam machining or mechanical machining, and accordingly, the conductive pattern 133, or the like, may be exposed. Thereafter, an external layer such as solder resist, or the like, may be formed to have an appropriate pattern on upper and lower surfaces thereof to obtain a package structure, and in this case, as described above, the support 160 may be removed at an appropriate time after the frame 130 is bonded.

As set forth above, the use of the electronic component package proposed according to exemplary embodiments in the present disclosure may reduce a size of a package, and has high utilization even when a plurality of electronic components are used. Since an electrical test on a wiring part of the electronic component package is performed before an electronic component is mounted, manufacturing efficiency may be considerably enhanced. In addition, the aforementioned electronic component package may be effectively manufactured using the manufacturing method according to an exemplary embodiment in the present disclosure.

While exemplary embodiments have been shown and described above, it will be apparent to those skilled in the art that modifications and variations could be made without departing from the scope of the present invention as defined by the appended claims.

What is claimed is:

1. An electronic component package comprising:
a wiring part including an insulating layer, a conductive pattern formed on the insulating layer, and a conductive via connected to the conductive pattern through the insulating layer;
an electronic component disposed on the wiring part;
a frame disposed on the wiring part and having a through hole accommodating the electronic component;
an adhesive layer bonding the wiring part and the frame to each other; and
an encapsulant filling at least a portion of the through hole.

2. The electronic component package of claim 1, wherein a portion of the adhesive layer is formed between an inner surface of the through hole and the electronic component.

3. The electronic component package of claim 2, wherein the adhesive layer formed between the inner surface of the through hole and the electronic component is in contact with the encapsulant.

4. The electronic component package of claim 1, wherein the adhesive layer is pre-preg.

5. The electronic component package of claim 1, wherein the adhesive layer is a solder resist.

6. The electronic component package of claim 1, wherein the insulating layer included in the wiring part includes a photocurable material.

7. The electronic component package of claim 1, further comprising a conductive via penetrating through the frame.

8. The electronic component package of claim 7, wherein the encapsulant covers the frame and exposes a region corresponding to the conductive via of the frame.

9. The electronic component package of claim 7, further comprising a conductive pattern formed on the encapsulant and electrically connected to the conductive via of the frame.

10. The electronic component package of claim 1, further comprising a solder resist formed on the wiring part and exposing an electrode pad connected to the electronic component.

11. The electronic component package of claim 1, further comprising a conductive pattern embedded in the insulating layer and positioned on a surface of the wiring part opposing a surface thereof on which the electronic component is disposed.

12. The electronic component package of claim 1, wherein the electronic component is electrically connected to the wiring part by a solder.

13. A method of manufacturing an electronic component package, the method comprising:
preparing a wiring part including an insulating layer, a conductive pattern formed on the insulating layer, and a conductive via connected to the conductive pattern through the insulating layer;
disposing an electronic component on the wiring part;
preparing a frame having a through hole and bonding the frame to an upper surface of the wiring part by an adhesive layer; and
forming an encapsulant to fill at least a portion of the through hole.

14. The method of claim 13, further comprising: performing an electrical test on the wiring part by applying an electrical signal to the conductive pattern disposed on the upper surface of the wiring part, prior to disposing the electronic component on the wiring part.

15. The method of claim 14, wherein the preparing of the wiring part includes forming the insulating layer, the conductive pattern, and the conductive via on a support, and the electrical test is performed in a state in which the support is coupled to the wiring part.

16. The method of claim 13, wherein in a region of the through hole, the adhesive layer is in contact with the encapsulant.

17. The method of claim 13, wherein the frame is bonded to the wiring part after the electronic component is disposed on the wiring part.

18. The method of claim 13, further comprising forming a conductive via penetrating through the frame, before bonding the frame to the upper surface of the wiring part.

19. The method of claim 13, further comprising forming a conductive via penetrating through the frame, after bonding the frame to the upper surface of the wiring part.

20. An electronic component package comprising:
a wiring part including an insulating layer, a conductive pattern formed on the insulating layer, and a conductive via connected to the conductive pattern through the insulating layer;
an electronic component disposed on the wiring part and having an electrode pad electrically connected to the conductive pattern through a conductive structure disposed therebetween;
a frame disposed on the wiring part and having a through hole accommodating the electronic component;
an adhesive layer bonding the wiring part and the frame to each other; and an encapsulant filling at least a portion of the through hole, wherein a melting temperature of the conductive structure is lower than that of the conductive pattern of the wiring part and the electrode pad of the electronic component.

21. The electronic component package of claim 20, wherein the encapsulant and the adhesive layer contact each other in a region of the through hole.

22. The electronic component package of claim 20, further comprising a conductive via penetrating through the frame and electrically connected to the conductive pattern of the wiring part.

23. The electronic component package of claim 22, wherein the encapsulant covers the frame and exposes a region corresponding to the conductive via of the frame.

24. The electronic component package of claim 20, further comprising a solder resist between the electronic component and the wiring part.

25. The electronic component package of claim 20, further comprising an underfill resin between the electronic component and the wiring part.

* * * * *